United States Patent
Yang et al.

(10) Patent No.: US 7,400,037 B2
(45) Date of Patent: Jul. 15, 2008

(54) PACKAGING STRUCTURE WITH COPLANAR FILLING PASTE AND DICE AND WITH PATTERNED GLUE FOR WL-CSP

(75) Inventors: Wen-Kun Yang, Hsin-Chu (TW); Chin-Chen Yang, Taipei (TW); Cheng-hsien Chiu, Kaohsing (TW); Wen-Bin Sun, Taipei (TW); Kuang-Chi Chao, Kaohsiung (TW); His-Ying Yuan, Taoyuan (TW); Chun-Hui Yu, Tainan (TW)

(73) Assignee: Advanced Chip Engineering Tachnology Inc., Hsinchu County (TW)

( * ) Notice: Subject to any disclaimer, the term of this patent is extended or adjusted under 35 U.S.C. 154(b) by 143 days.

(21) Appl. No.: 11/026,488

(22) Filed: Dec. 30, 2004

(65) Prior Publication Data
US 2006/0145364 A1    Jul. 6, 2006

(51) Int. Cl.
H01L 23/34    (2006.01)
(52) U.S. Cl. ............... 257/723; 257/E25.12; 438/107
(58) Field of Classification Search ......... 257/460–465, 257/723, E25.012; 438/107
See application file for complete search history.

(56) References Cited

U.S. PATENT DOCUMENTS

| | | | |
|---|---|---|---|
| 3,947,303 A | 3/1976 | Schäfer | 156/3 |
| 5,953,588 A | 9/1999 | Camien et al. | 438/106 |
| 6,130,116 A | 10/2000 | Smith et al. | 438/127 |
| 6,429,045 B1 * | 8/2002 | Furukawa et al. | 438/107 |
| 6,489,185 B1 | 12/2002 | Towle et al. | 438/127 |
| 6,544,814 B1 | 4/2003 | Yasunaga et al. | 438/108 |
| 6,627,477 B1 * | 9/2003 | Hakey et al. | 438/106 |
| 6,827,636 B2 * | 12/2004 | Yamada | 451/65 |
| 2003/0040142 A1 | 2/2003 | Lin et al. | 438/118 |
| 2004/0032013 A1 | 2/2004 | Cobbley et al. | 257/678 |

FOREIGN PATENT DOCUMENTS

| | | |
|---|---|---|
| DE | 102 34 951 A1 | 2/2004 |
| EP | 0 611 129 A2 | 8/1994 |
| EP | 1 152 464 A2 | 7/2001 |

* cited by examiner

*Primary Examiner*—Howard Weiss
(74) *Attorney, Agent, or Firm*—Kusner & Jaffe (57) ABSTRACT

A filling paste structure and process of wafer level package is disclosed. The process comprises filling an adhesive material to fill among plurality of dice and cover the plurality of dice. The pluralities of dice are adhered to glue pattern with viscosity in common state formed on a removable substrate. A rigid substrate is coated by adhesive material to adhere the dice. Then, pluralities of dice are departed from the glue pattern by a special environment after attaching the rigid base substrate.

12 Claims, 7 Drawing Sheets

PACKAGING STRUCTURE WITH COPLANAR FILLING PASTE AND DICE AND WITH PATTERNED GLUE FOR WL-CSP

CO-REFERENCE TO RELATED APPLICATION

The present application is related to the following co-pending application: Ser. No. 10/842,959 entitled "Manufacturing Tool for Wafer Level Package and Method of Placing dies" filed on May 10, 2004 and commonly assigned to the present assignee, the contents of which are herein incorporated by reference.

BACKGROUND OF THE INVENTION

1. Field of the Invention

This invention relates to a filling paste structure and process of wafer level package, and more particularly to a structure and process by using the top side face down filling paste to make flatness of dice surface and without overflowing or recessing on the surface of dice, thereby improving filling paste performance and life cycle during reliability testing.

2. Description of the Prior Art

As a suitable semiconductor device for a high-pin-count package, a semiconductor device having a BGA (Ball Grid Array) structure has been developed. In this semiconductor device with a BGA structure, a semiconductor chip is mounted on a chip mount area of a main surface of a base substrate by using adhesive material and several bump electrodes are positioned in an array on the back side thereof that is opposite to said main surface of the base substrate.

The CSP has been conventionally formed by a method in which a semiconductor wafer is cut into semiconductor chips, then the semiconductor chips are mounted on a base substrate serving as a package base at predetermined positions and bonded thereto, and they are collectively sealed with a resin, thereafter the sealing resin and the base substrate are cut into pieces together at the parts between the semiconductor chips. In another conventional method, a semiconductor wafer (not being cut into semiconductor chips yet) is mounted on a base substrate and bonded thereto, then the semiconductor wafer and the base substrate are cut together, and the cut and divided semiconductor chips and package bases are sealed with a resin.

However, in the former conventional manufacturing method, a problem exists in that the method essentially includes a step of positioning and mounting the cut and divided semiconductor chips one by one on the base substrate. Like wise in the latter conventional manufacturing method, a problem exists in that the method essentially includes a step of sealing the cut and divided semiconductor chips and package bases one by one with a resin. Both conventional methods require a number of working processes equal to the number of semiconductor chips, which results in a disadvantage of low productivity.

Figure 1:
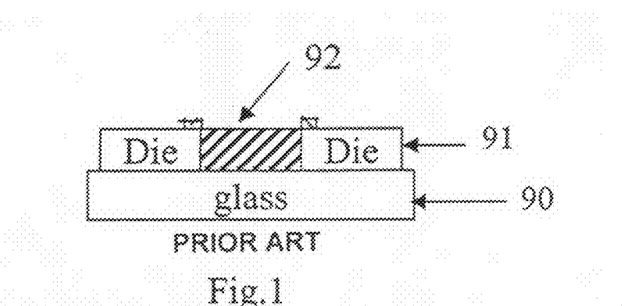
FIG. 1 is a schematic diagram of printing filling paste among the dice formed on a glass base substrate according to prior art.
Figure 2A:
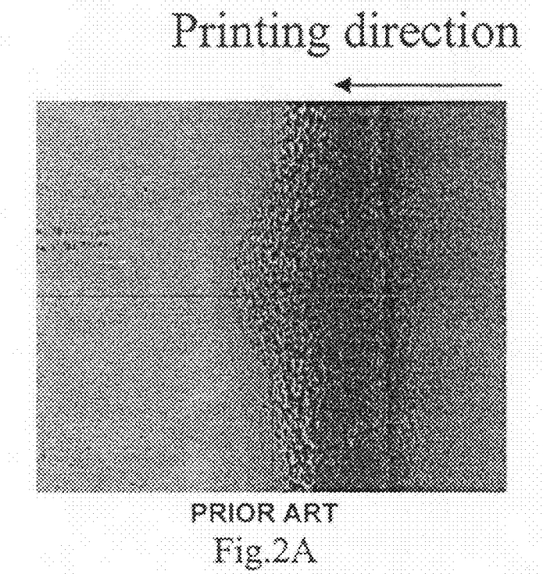
FIG. 2A and 2B are schematic diagrams of the filling paste in printing direction and non-printing direction according to prior art, respectively.
Figure 2B:
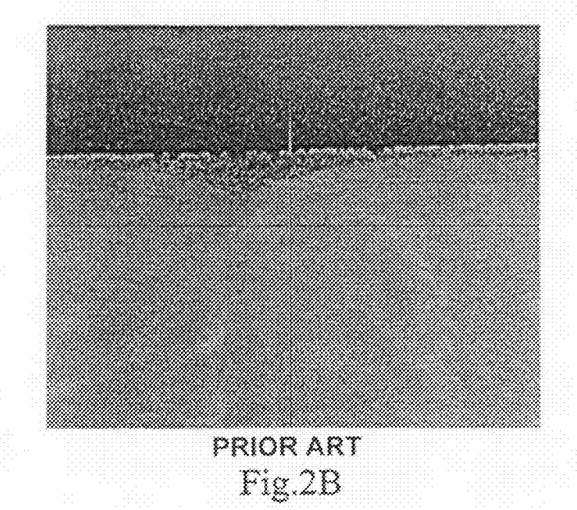

Besides, at present, filling paste process of any type IC device package is adopted directly printing filling paste among the dice, shown as FIG. 1. The pluralities of dice 91 are formed on a glass base substrate 90. Silicone rubber 92 is formed on the glass base substrate 90 by using a printing method. In general, such filling paste technique causes an overflow filling paste on the surface of the dice in printing direction and a recess filling paste on the surface of the dice in non-printing direction, shown as FIG. 2A and FIG. 2B, respectively. The filling paste may cover the bonding pad of the die. That is to say, such filling paste process of prior art will suffer yield and reliability issues owing to poor uniformity of the filling paste on the surface of the dice.

Therefore, the present provides a new filling paste process of wafer level package to improve yield and reliability of the dice of wafer level package.

SUMMARY OF THE INVENTION

The main objective of the present invention is to provide a filling paste structure and process of wafer level package. The good dice are selected from the processed wafer and place the good dice on a tool by using a pick and place system. The fill paste process of the present invention can improve yield and reliability of the dice of wafer level package.

Another object of the present invention is that providing a packaging structure with a non-glue pattern area formed under the dice and the glue pattern area attached on the edge of the dice for bonding the dice on the removable substrate.

The another objective of the present invention is to use the top side face down filling paste to make flatness of the dice surface and no overflow or recess fill paste on the surface of dice.

The yet objective of the present invention is to use the new fill paste method to improve fill paste performance and life cycle during reliability testing.

A filling paste structure for package, comprises a removable base substrate and a glue pattern formed on the removable base substrate. Plurality of dice are placed on the glue pattern. An adhesive material is filled among the plurality of dice and covered the plurality of dice.

The above-mentioned filling paste structure for package further comprises a rigid substrate placed on the adhesive material. A protection film is optionally formed on the rigid substrate. The protection film is formed by printing, coating, tapping or molding method.

The material of the removable base substrate comprises silicon, glass, quartz or ceramic. The material of the rigid base substrate comprises silicone, glass, quartz, ceramic, alloy 42 or PCB. The material of the adhesive material is an elastic material, and material of the elastic material comprises silicone rubber, silicone resin, elastic PU, porous PU, acrylic rubber or die sawing tape (Blue tape/UV tape). The elastic material is formed by spin coating, printing.

The pluralities of dice are back upwardly adhered on the glue pattern, and the die's back is adhered to the adhesive material. The within scribe line of each one of the plurality of dice is adhering on the glue pattern, and then fills the adhesive material.

The filling paste process of wafer level package of the present invention further comprises a step of UV curing or heat curing after the step of attaching a rigid base substrate.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited expect as specified in the accompanying claims. Then, the components of the different elements are not shown to scale. Some dimensions of the related components are exaggerated and meaningless portions are not drawn to provide clearer description and comprehension of the present invention.

Figure 3:
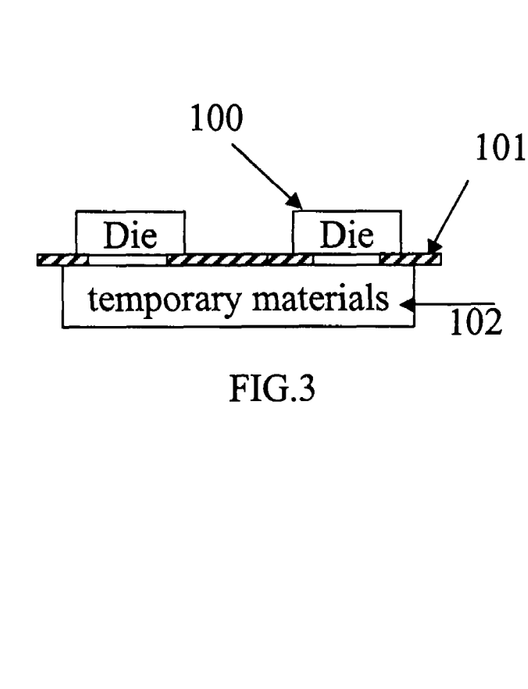
FIG. 3 is a schematic diagram of adhering a plurality of dice on a glue pattern formed on a removable base substrate of the present invention.

Referring to FIG. 3, it is a schematic diagram illustrating the step of adhering pluralities of dice on a glue pattern formed on a removable substrate 102 of the present invention. As shown in FIG. 3, pluralities of dice 100 are placed on a glue pattern 101. In general, the plurality of dice 100 are placed on the glue pattern 101 by using a pick and place system. The pick and place system can be regarded as a movable flip chip bonder. The glue pattern 101 is formed on a removable substrate 102. In one embodiment, the material of the removable substrate 102 is silicone, glass, quartz, or ceramic.

Figure 4:
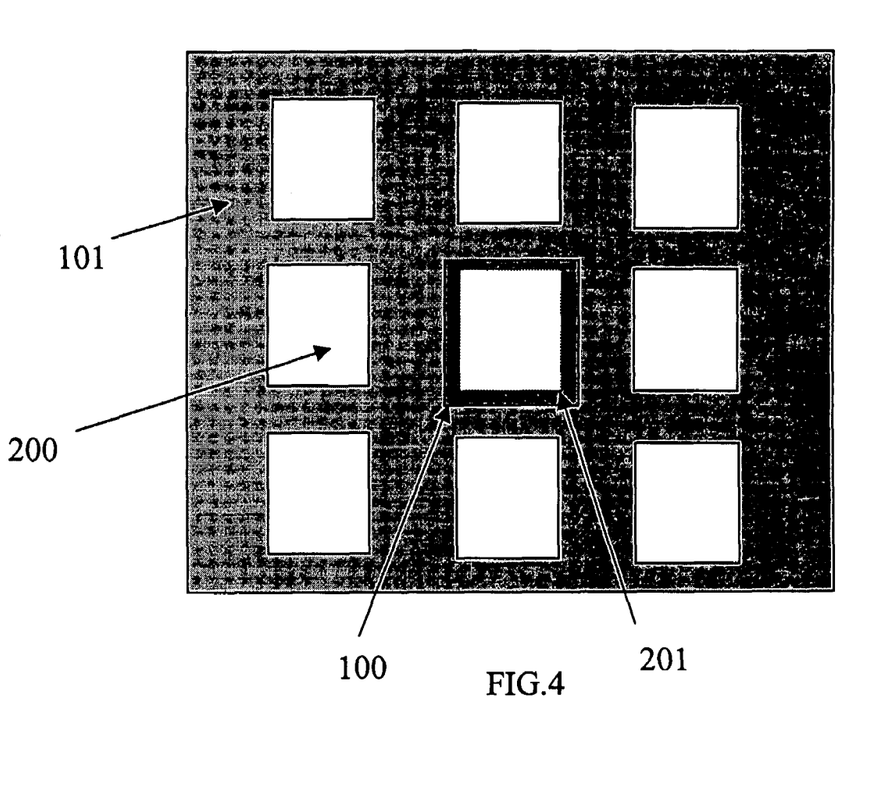
FIG. 4 is a top view of adhering the plurality of dice on the glue pattern formed on the removable base substrate of the present invention.

Referring to FIG. 4, glue pattern 101 is formed on the removable substrate 102 (as shown in FIG. 3) by using a printing method. The reference 200 is non-glue pattern printing area. In one embodiment, the plurality of dice 100 are back upwardly adhered on the glue pattern 101. Besides, an edge 201 of each one of the plurality of dice 100 is downwardly (having bonding pads side) adhered on the glue pattern 101. That is, the die 100 may be adhered to the glue pattern 101 at the edge 201. In general, the edge 201 is a scribe line of the dice 100, therefore inter-connectors of the dice 100 may be not adhered to the glue pattern 101. As shown in FIG. 6, a glue pattern 101 is formed at the edge 201 of the dice 100 and a space therefore is formed between the dice 100 and the removable substrate 102; the space means the area 200 in FIG. 4 and the blank space directly beneath the die in FIGS. 2 and 5-7. As noted, bonding pads side of the dice 100 are placed on the glue pattern 101. The pluralities of dice are substantially aligned to the edge of the glue pattern so as to prevent bonding pads of the pluralities of dice from being covered by any material.

Figure 5:
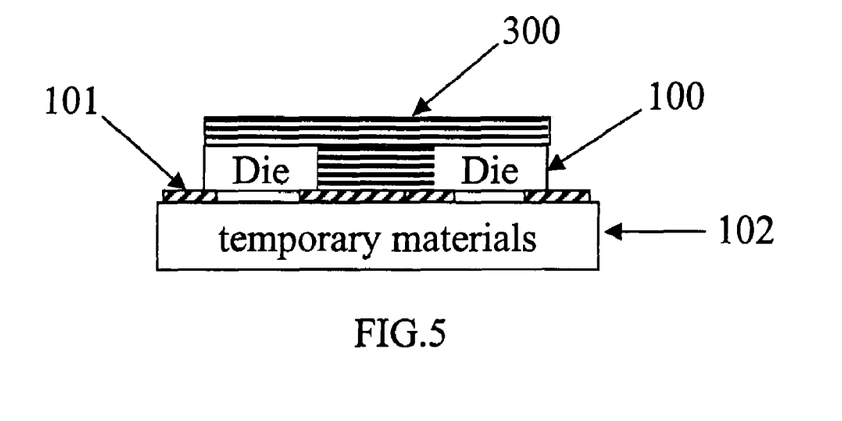
FIG. 5 is a schematic diagram of filling an adhesive material to fill among the plurality of dice and cover the plurality of dice of the present invention.
Figure 6:
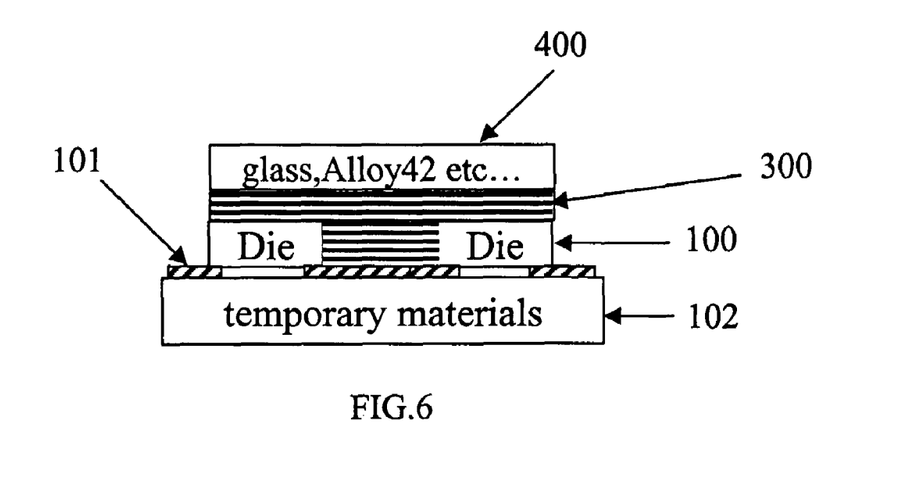
FIG. 6 is a schematic diagram of attaching a rigid base substrate to the adhesive material of the present invention.

Referring to FIG. 5, it is a schematic diagram illustrating the step of filling an adhesive material to fill among the plurality of dice and cover the plurality of dice of the present invention. As shown in FIG. 5, the adhesive material 300 may be filled among the plurality of dice 100 and covered the plurality of dice 100. In one embodiment, the adhesive material 300 is an elastic material, such as silicone rubber, silicone resin, elastic PU, porous PU, acrylic rubber, blue tape or UV tape. The adhesive material 300 may be formed by spin coating, printing or injection molding. Therefore, the plurality of dice 100 is back upwardly adhered on the adhesive material 300.

At the moment, the filling paste structure for package of the present invention comprises a removable substrate or a temporary substrate 102. A glue pattern 101 is formed on the removable substrate 102. Pluralities of dice 100 are placed on the glue pattern 101. An adhesive material 300 is filled among the plurality of dice 100 and covered the plurality of dice 100, shown as FIG. 5.

Referring to FIG. 6, it is a schematic diagram illustrating the step of attaching a rigid substrate 400 to the adhesive material 300 of the present invention. As shown in FIG. 6, a rigid substrate 400 is attached to the adhesive material 300. In one embodiment, material of the rigid substrate 400 comprises silicone, glass, quartz, ceramic, alloy 42 (commercial name) or PCB. A step of UV curing or heat curing is performed after attaching the rigid substrate 400 to the adhesive material 300 to enhance adhering performance.

The filling paste structure for package further comprises a rigid substrate 400 placed on the adhesive material 300, shown as FIG. 6. The filling paste structure for package further comprises a protection film 500 formed on the rigid substrate 400, shown as FIG. 7. The temporary substrate 102 could be removed.

Figures 7, 8, 9:
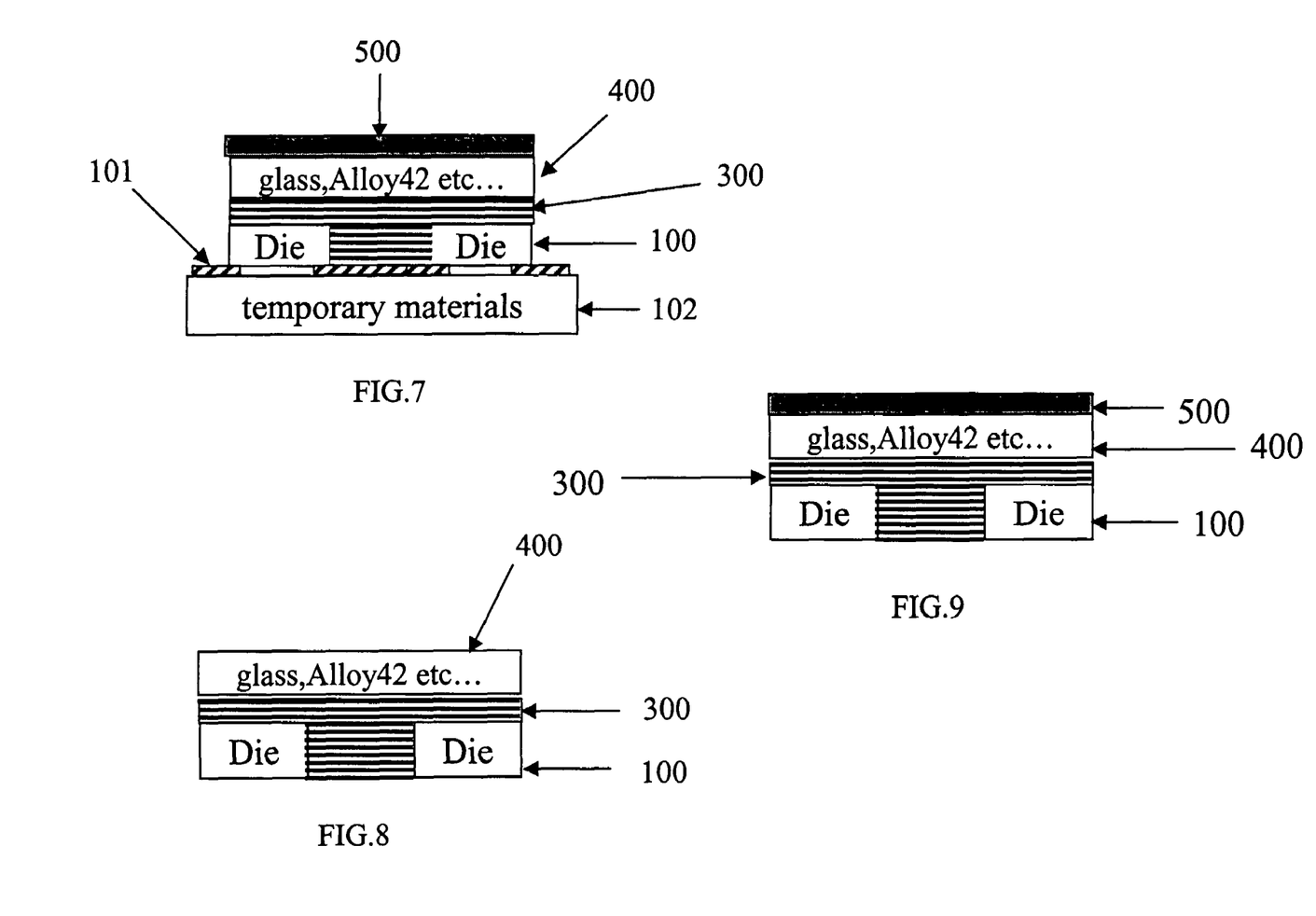
FIG. 7 is a schematic diagram of forming a protection film on the rigid base substrate of the present invention.
FIG. 8 is a schematic diagram of stripping the plurality of dice from the glue pattern of the present invention.
FIG. 9 is a schematic diagram of forming a protection film on the rigid base substrate of the present invention.

Beside, a protection film 500 is formed on the rigid substrate 400, shown as FIG. 7. The protection film 500 is formed by a printing, coating, tapping or molding method. In one embodiment, the protection film 500 is resin, compound, epoxy, silicone, silicone rubber, silicone resin, elastic PU, porous PU, acrylic rubber, blue tape or UV tape. Referring to FIG. 8, it is a schematic diagram of stripping the glue pattern 101 or the temporary substrate 102 from the plurality of dice by a special or predetermined treatment. That is to say, surface of the glue pattern 101 has viscosity in common state, and it lose viscosity when the glue pattern 101 is placed in a special or predetermined environment. The special or predetermined environment may be the solution of DI water, solvent, predetermined temperature around 20-40 centigrade degree depending on the solution, or specific light (such as UV light) etc. The engagement of the glue pattern 101 and the dice 100 can be lost through the treatment in the special or predetermined environment. Subsequently, the glue pattern 101 can be stripped from the dice 100. In one embodiment, material of the glue pattern 101 is seeling glue, water soluble UV glue, reworkable UV glue or high melting point wax.

The filling paste process of wafer level package of the present invention may further comprise a step of forming a protection film 500, acting as a buffer, on back side of the rigid substrate 400, as shown in FIG. 9. The protection film 500 is formed by a printing, coating, tapping or molding method. In one embodiment, the protection film 500 is resin, compound, epoxy, silicone, silicone rubber, silicone resin, elastic PU, porous PU, acrylic rubber, blue tape or UV tape.

A filling paste structure for package of the present invention comprises plurality of dice 100, an adhesive material 300 is filled among the plurality of dice 100 and covered the plurality of dice 100. A rigid substrate 400 is placed on the adhesive material 300, shown as FIG. 8. Alternatively, the filling paste structure for package further comprises a protection film 500 formed on the rigid base substrate 400, shown as FIG. 9.

Figure 10A:
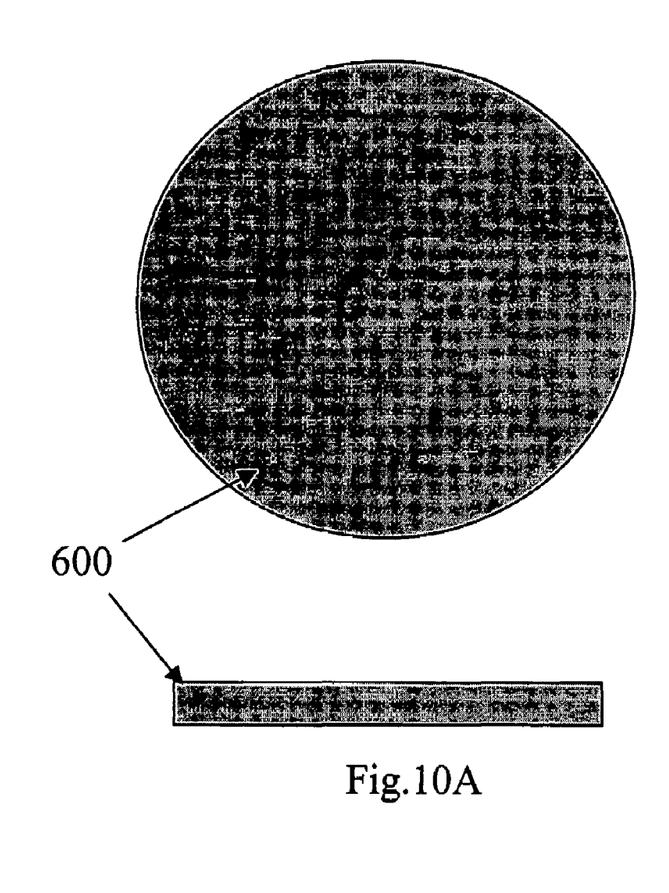
FIGS. 10A and 10B are schematic diagrams of a pure wafer and a pure wafer with a molding compound, respectively.
Figure 10B:
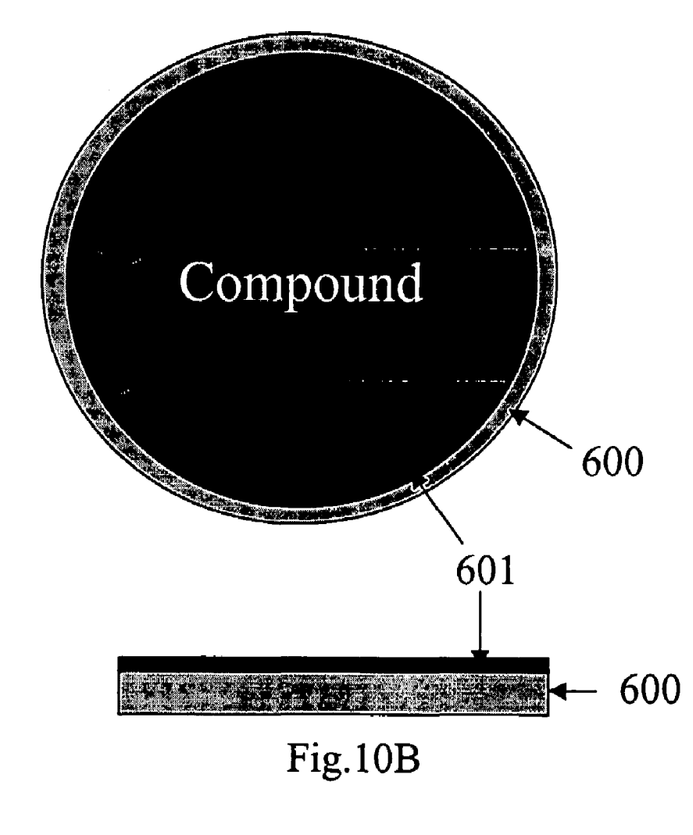

Referring to FIGS. 10A and 10B, they are schematic diagrams of a pure wafer 600 and a pure wafer 600 with a molding compound 601, respectively.

Figure 11A:
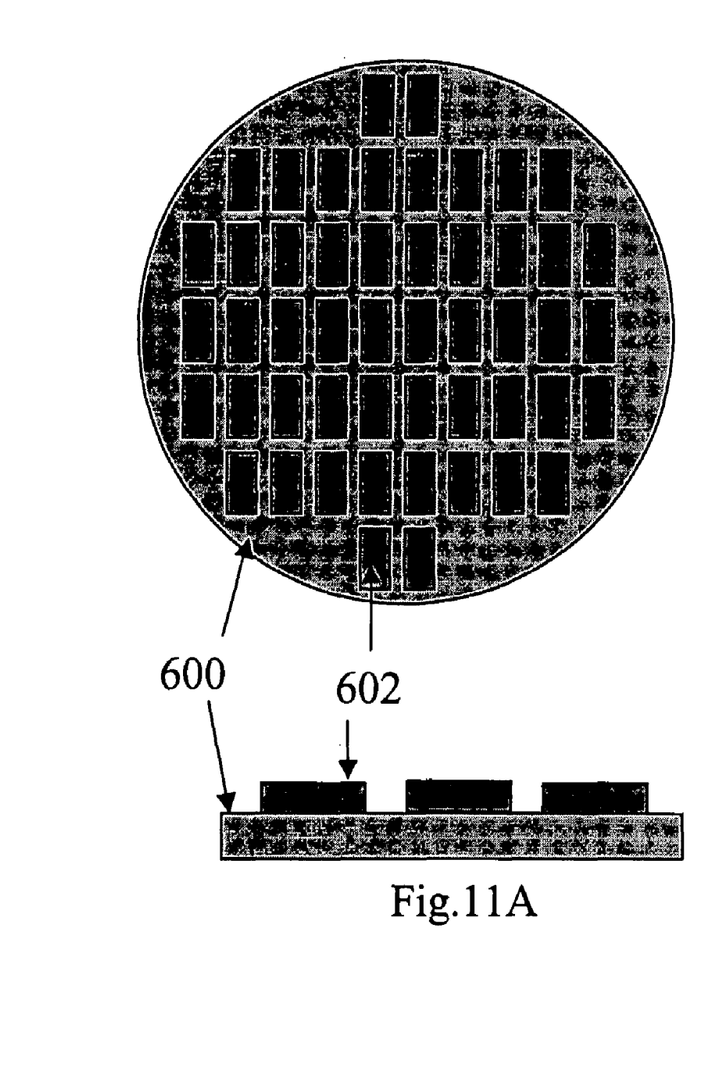
FIGS. 11A and 11B are schematic diagrams before and after molding of dice bonded on a base substrate, respectively.
Figure 11B:
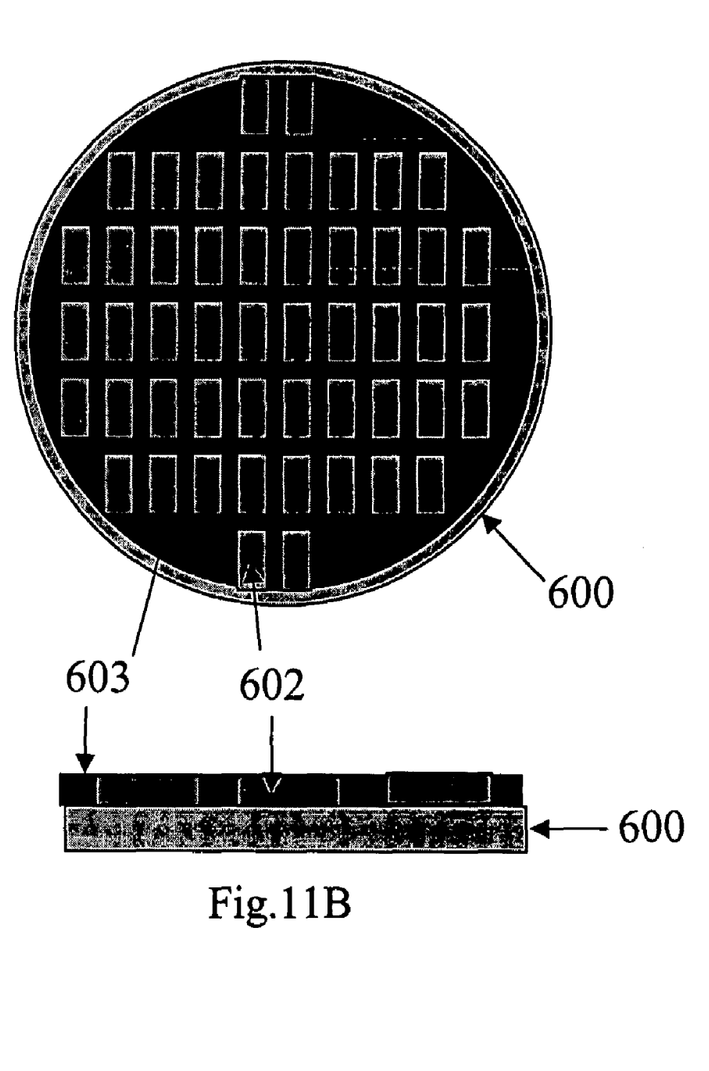

Referring to FIGS. 11A and 11B, they are schematic diagrams before and after molding of dice bonded on a base substrate, respectively. A processed wafer is diced to plurality of dice 602, and the dice 602 are bonded on a base substrate 600. An adhesive material 603 is filled among the plurality of dice 602 by using a molding method.

Figure 12:
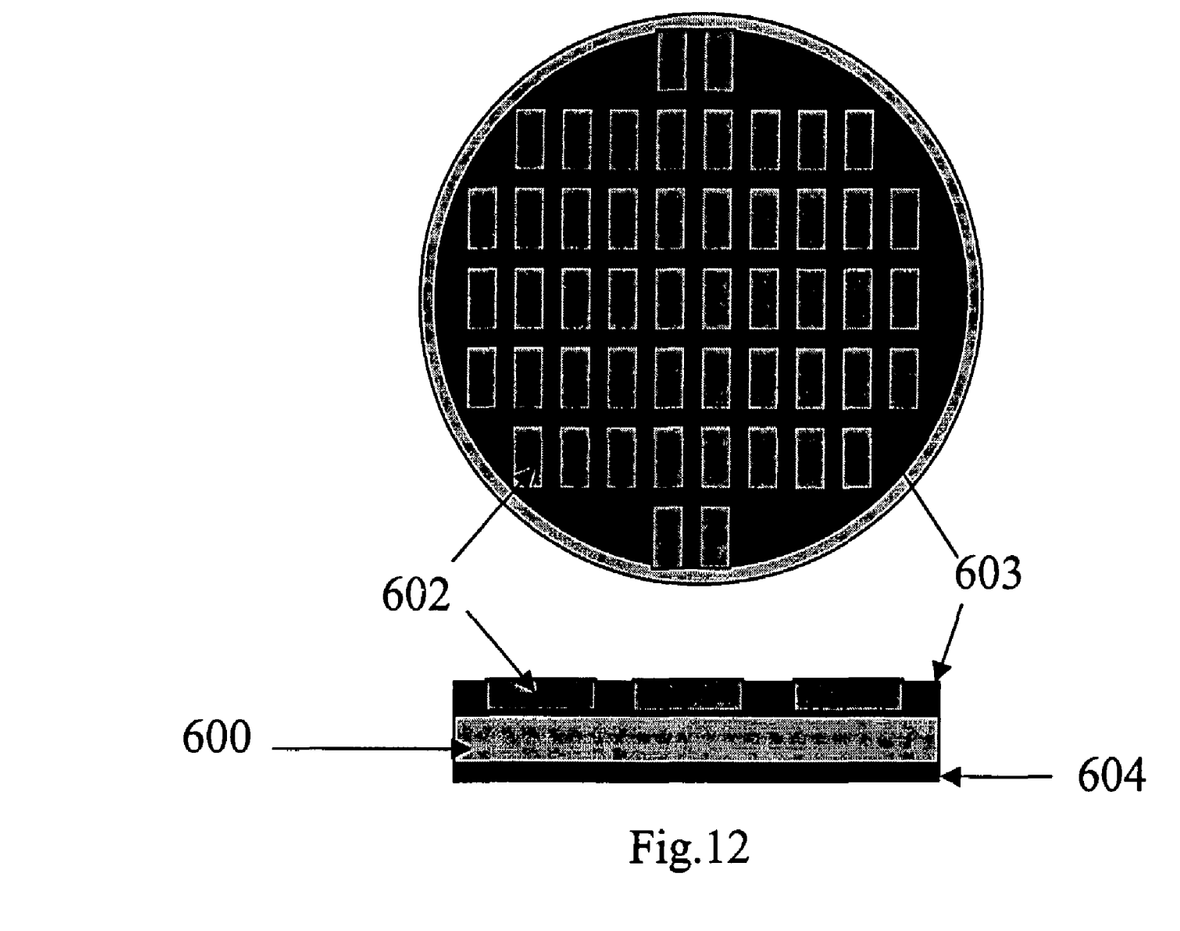
FIG. 12 is a schematic diagram of forming a protection film on back side of the base substrate.

Referring to FIG. 12, it is a schematic diagram of forming a protection film on back side of the base substrate. The protection film 604 is formed by a printing, coating, tapping or molding method. In one embodiment, the protection film 604 is resin, compound, epoxy, silicone, silicone rubber, silicone resin, elastic PU, porous PU, acrylic rubber, blue tape or UV tape. The protection film 604 is capable of enhancing toughness of the wafer level package, marking by laser/ink and facilitating to cut.

In the present invention, filling paste among the plurality of dice 100 can meet the flatness of +/−25 um(micron) by using molding/printing method. It is a different method from conventional method which is directly molding filling past among the dice. Therefore, the fill paste process of wafer level package of the present invention can avoid an overflow or recess filling paste on the surface of the dice, thereby improving fill paste performance and life cycle during reliability testing.

Although specific embodiments have been illustrated and described, it will be obvious to those skilled in the art that various modifications may be made without departing from what is intended to be limited solely by the appended claims.

What is claimed is:

1. A filling paste structure for package, comprising:
a glue pattern formed on a removable substrate to create non-glue pattern area and glue pattern area;
pluralities of dice adhered on said glue pattern topside down, wherein the edge of said dice are substantially aligned to the edge of said glue pattern area, thereby forming a closed space between said dice and said removable substrate by said non-glue pattern area;
an adhesive material filled among said plurality of dice and covering said plurality of dice, wherein part of said adhesive material is connected to said glue pattern on a region free of said dice; and
wherein said adhesive material is without overflowing or recessing on the surface of said dice.

2. The structure in claim 1, wherein material of said glue pattern is sealing glue, water soluble UV glue, reworkable UV glue or high melting point wax.

3. The structure in claim 1, wherein material of said removable substrate is silicone, glass, quartz or ceramic.

4. The structure in claim 1, wherein material of said adhesive material is an elastic material.

5. The structure in claim 4, wherein material of said elastic material is silicone resin, elastic PU, porous PU, acrylic rubber, blue tape or UV tape.

6. The structure in claim 1, wherein said pluralities of dice are back upwardly adhered on said glue pattern, and the back of pluralities of dice is adhered to said adhesive material.

7. The structure in claim 6, wherein each one of said pluralities of dice is adhered on said glue pattern within a scribe line.

8. The structure in claim 1, further comprising a rigid substrate placed on said adhesive material.

9. The structure in claim 8, wherein material of said rigid base substrate comprises silicone, glass, quartz, ceramic, alloy 42 or PCB.

10. The structure in claim 8, further comprising a protection film formed on said rigid substrate.

11. The structure in claim 10, wherein said protection film is capable of marking by laser or ink.

12. The structure in claim 10, wherein material of said protection film is resin, compound, epoxy, silicone, blue tape, UV tape, silicone rubber, silicone resin, elastic PU, porous PU or acrylic rubber.

* * * * *